United States Patent
Zhou

(10) Patent No.: US 7,277,682 B2
(45) Date of Patent: Oct. 2, 2007

(54) RF PASSIVE MIXER WITH DC OFFSET TRACKING AND LOCAL OSCILLATOR DC BIAS LEVEL-SHIFTING NETWORK FOR REDUCING EVEN-ORDER DISTORTION

(75) Inventor: Sining Zhou, Los Angeles, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 412 days.

(21) Appl. No.: 10/147,699

(22) Filed: May 16, 2002

(65) Prior Publication Data

US 2003/0216128 A1    Nov. 20, 2003

(51) Int. Cl.
*H01Q 11/12* (2006.01)
(52) U.S. Cl. .............. 455/127.1; 455/323; 455/260; 455/343.1; 370/350
(58) Field of Classification Search ............ 455/127.1, 455/343.1, 323, 260; 370/350
See application file for complete search history.

(56) References Cited

U.S. PATENT DOCUMENTS

| | | | |
|---|---|---|---|
| 3,805,162 A * | 4/1974 | Hoffmann et al. ....... | 455/236.1 |
| 5,317,280 A * | 5/1994 | Zimmer et al. ........... | 330/261 |
| 5,513,184 A * | 4/1996 | Vannucci ................. | 370/350 |
| 5,724,653 A * | 3/1998 | Baker et al. ............. | 455/296 |
| 5,752,181 A * | 5/1998 | Vice ....................... | 455/326 |
| 6,021,323 A * | 2/2000 | Vagher .................... | 455/324 |
| 6,138,000 A | 10/2000 | Navid et al. | |
| 2002/0004376 A1 * | 1/2002 | Lee et al. ................ | 455/326 |

* cited by examiner

*Primary Examiner*—Jean Gelin
*Assistant Examiner*—Pierre-Louis Desir
(74) *Attorney, Agent, or Firm*—DLA Piper US LLP

(57) ABSTRACT

An apparatus and method for tracking a DC offset in a mixer circuit used in wireless communication systems and for providing local oscillator DC bias level-shifting to reduce even order distortion resulting from the DC offset is described. The apparatus has an input coupled to a mixer circuit output for receiving a DC voltage present on the mixer circuit output. The DC voltage includes an offset component. A level shifting circuit is coupled to the input for level shifting the received DC voltage a predetermined amount. An output of the level shifting circuit is coupled to a local oscillator input for outputting the level shifted DC voltage to the local oscillator input. The shift in the DC bias level at the local oscillator input of the mixer circuit provided by the apparatus and method reduces even order distortion in the mixer circuit, including second order intermodulation (IM2) distortion.

35 Claims, 6 Drawing Sheets

RF PASSIVE MIXER WITH DC OFFSET TRACKING AND LOCAL OSCILLATOR DC BIAS LEVEL-SHIFTING NETWORK FOR REDUCING EVEN-ORDER DISTORTION

BACKGROUND OF THE INVENTION

1. Field of the Invention

Embodiments of the present invention relate to mixer circuits for use in communication systems, and in preferred embodiments, to an apparatus and method for tracking a DC offset in a direct conversion passive mixer circuit used in wireless communication systems and for providing local oscillator DC bias level-shifting to reduce even order distortion, including second order intermodulation (IM2) distortion, resulting from the DC offset, and to wireless communication systems that employ such an apparatus and method.

2. Description of Related Art

Mixers are used in transceivers in many commercial wireless applications, including wireless Local Area Networks (LANs), wireless personal communication devices including radios, cellular telephones, mobile cordless telephones, Personal Digital Assistants (PDAs), Personal Computer Memory Card International Association (PCMCIA) computer interface applications, telemetry systems, global positioning systems (GPS) and other radio frequency (RF) devices.

In such applications, the transmitted and received signal is an RF signal. The RF signal consists of a baseband signal modulated on a carrier frequency signal. Because the baseband signal is a relatively low frequency signal, the baseband signal is modulated onto the higher frequency carrier signal before transmission. Conversely, because the carrier frequency is a relatively high frequency signal, the RF signal is down-converted to a lower frequency upon reception and before further processing.

Conventional heterodyne receivers down convert a RF signal to a baseband signal using one or more intermediate stages in which the RF signal is converted to one or more intermediate-frequency signals, lower than the RF signal, until the base-band frequency is reached. A heterodyne transmitter generates a higher frequency RF signal from a baseband signal using one or more intermediate stages to up-convert the frequency.

A homodyne or "direct conversion" receiver directly down-converts RF signals to baseband frequency without intermediate stages. Analogously, a direct conversion transmitter up-converts from base-band to RF without intermediate stages. A direct conversion receiver may be defined more generally as a receiver that directly converts any frequency to DC. Direct conversion transceivers are particularly useful in multi-band transceivers, because of the elimination of the intermediate frequency passband filtering components and the resulting space savings. In addition, in direct conversion transceivers there is a corresponding reduction in the complexity of the transceivers.

Mixers are used in transceivers to convert a signal from a low frequency to a high frequency or a high frequency to a low frequency by mixing the signal with a local oscillator signal. The local oscillator frequency can be above or below the frequency of the desired signal to produce a sum and a difference frequency, one of which is the frequency of interest. There are many types of mixers including unbalanced, single and double balanced mixers. Mixers may be further categorized as passive or active.

Conventional mixers are implemented in various semiconductor technologies such as silicon and gallium arsenide with diodes, bipolar junction transistors (BJT), field effect transistors (FET), or other variations of these types. Increasingly, integrated circuits (ICs) having complementary metal-oxide semiconductor (CMOS) technology are being used in RF circuits, including RF circuits for wireless (LAN) networks.

Thus, increasingly, direct conversion transceivers implemented with CMOS technology are being used in such wireless communication applications. Mixers used in direct conversion transceivers generally require low flicker (1/f) noise. The 1/f noise is an intrinsic noise phenomenon found in semiconductor devices. Active mixer circuits implemented in CMOS generally suffer from 1/f problems. Passive mixer circuits implemented in CMOS, on the other hand, generally exhibit a low noise figure. Thus, it is advantageous to use passive mixer circuits in direct conversion transceivers implemented with CMOS technology due to the improved noise figure.

A conventional CMOS implemented passive mixer circuit used in a receiver is shown in FIG. 1. In FIG. 1, the RF input signal to be down converted is fed into input terminals 101 and 103 and through capacitors 112 and 114 to the source terminals of the NMOS FET differential pairs 102 (M1), 104 (M2) and 106 (M3), 108 (M4) of passive mixer circuit 100. The local oscillator signal (LO) to be mixed with the RF signal is fed into input terminal 105 and through capacitor 116 to the gate terminals of FETs 102 and 108. The 180-degree phase shifted or "complementary" local oscillator signal (LOC) to be mixed with the RF signal is fed into input terminal 107 and through capacitor 118 to the gate terminals of FETs 104 and 106. A transformer or other phase shifting device (not shown) can provide this phase shift input.

A baseband (BB) signal is output at output terminals 113 and 115. DC power and biasing are provided via $V_{BIAS}$ terminal 109 through resistors 120 and 122 to the drain terminals of differential pairs 102, 104 and 106, 108 of passive mixer circuit 100. Capacitors 128 and 130 short higher frequencies appearing on output terminals 113 and 115 to $V_{BIAS}$ terminal 109. DC power and biasing are also provided via $V_{LO\_BIAS}$ terminal 111 through resistors 124 and 126 to the gate terminals of differential pairs 102, 104 and 106, 108.

Because the differential pairs 102, 104 and 106, 108 are driven by local oscillator signals that are 180 degrees out of phase, only one of FET pair 102, 108 or FET pair 104, 106 is on at a given time. Passive mixer circuit 100 multiplies the incoming signal RF-in with the local oscillator signal, producing sum and difference frequencies.

High linearity performance is required in mixer circuits used in wireless communication applications. Passive mixer circuits such as the one shown in FIG. 1 generally have poor linearity performance. One parameter by which the linearity performance of a mixer may be defined is the even order distortion of the mixer. The most significant form of even order distortion in a mixer is second order intermodulation (IM2) distortion. IM2 occurs when two interfering signals mix with each other through a second order nonlinearity to produce an intermodulation product at the sum and difference frequencies of the two interferers. IM2 may be produced, for example, by device mismatches, parametric imbalance, imperfect layout, and other device characteristic inequalities that cause imbalances in a differential pair.

A particular cause of IM2 in a passive mixer circuit like that shown in FIG. 1 are DC offsets caused by LO leakage. There are several mechanisms through which LO leakage may occur. For example, there may be conductive paths between components. This occurs because there is limited isolation from the LO input terminals of the mixer to the RF input terminals of the mixer. There may also be limited reverse isolation through the low-noise amplifying stages preceding the mixer. A parasitic signal path for signals through the substrate, as well as a lateral signal path through the substrate, can also occur. In addition to the conductive paths, there may also be radiated paths via the bond wires used to interconnect the circuit blocks to the outside world. The bond wires act as antennas and couple RF energy, such as that of the LO, to adjacent pins. The lack of LO isolation causes self mixing in the direct down converter that manifests as a DC offset at the baseband terminals of the mixer. This DC offset then negatively affects the bias voltages of the passive mixer 100.

Referring again to FIG. 1, differential pair 102, 104 will be used to describe a typical biasing method for the passive mixer 100. Differential pair 106, 108 is biased in a similar manner. A DC bias voltage of 1.2 Volts (V) is provided at $V_{LO\,BIAS}$ terminal 111. Thus, the DC voltage present at the gate terminals of NMOS FETs 102 or 104, respectively, is 1.2 V. A typical value of DC bias voltage provided at $V_{BIAS}$ terminal 109 is 0.6 V. Because mixer 100 is a passive mixer, there is no current flow through NMOS FETs 102 or 104. Because there is no current flow through NMOS FETs 102 or 104, the DC voltage present at output terminals 113 and 115, and also at the respective drain terminals of NMOS FETs 102 or 104, should ideally be 0.6 V, i.e. the DC voltage present at $V_{BIAS}$ terminal 109.

As stated above, because in operation FETs 102 and 104 are driven by local oscillator signals that are 180 degrees out of phase, only one of them is on at a given time. When either of the FETs 102 and 104 are turned on by the LO or LOC signals, respectively, the DC voltage present at their source terminals will be that present at their respective drain terminals, that is, ideally 0.6 V.

However, because of the DC offset manifested at the output terminals 113 and 115 by the LO self-mixing, the actual DC voltage present on output terminal 113 may vary from the DC voltage present on output 115. As an example, instead of the ideal DC voltage of 0.6 V that should be present at both output terminals 113 and 115, a DC voltage of 0.7 V may be present at output terminal 113, while a DC voltage of 0.5 V may be present at output terminal 115. Thus, in the present example there is a DC offset between output terminals 113 and 115 of 0.2 V. Therefore, when FET 102 is turned on, the DC voltage at its source terminal will be pulled up to 0.7 VDC. When FET 104 is turned on, the DC voltage at its source terminal will be pulled down to 0.5 VDC.

Referring now to FIGS. 2A through 2D, the negative effects on the linear performance of passive mixer 100 of LO self-mixing and the resulting DC offsets are illustrated. FIGS. 2A through 2D show waveforms present at the terminals of FETs 102 and 104 during operation of the passive mixer 100.

FIG. 2A represents the LO and LOC signals superimposed on one another on a horizontal axis representing time t. During operation of passive mixer 100, the LO and LOC signals are input to the gate terminals of FETs 102 and 104, respectively, as shown in FIG. 1. The LO and LOC signals switch their respective FETs on and off. As discussed above, the LO and LOC signals are 180 degrees out of phase and thus when FET 102 is switched on, FET 104 is switched off, and vice versa.

FIG. 2B represents output signals seen at the drain terminals of FETs 102 and 104. The slow-varying solid lines represent the baseband signal waveforms present at the terminals of FETs 102 and 104 during operation of the passive mixer 100. FIG. 2B shows that due to the DC offset of 0.2 V introduced by the LO self-mixing, the DC voltages at the drain terminals of FETs 102 and 104 deviate from each other by 0.2 V. Thus, the output signals present on the drain terminals of FETs 102 and 104 ride on DC levels that are offset by 0.2 V.

FIG. 2C represents the signal input seen at the source terminals of FETs 102 and 104. When either FET 102 or FET 104 turns on, the DC voltage at its drain terminal will be extended to its source terminal. Thus, as shown in FIG. 2C, when FET 102 turns on, the RF input signal at its source terminal will ride on a DC level that is shifted up from the original DC level of 0.6 V to 0.7 V. Similarly, when FET 104 turns on, the RF signal input at its source terminal will ride on a DC level that is shifted down from the original DC level of 0.6 V to 0.5 V.

FIG. 2D shows the gate-to-source voltage (Vgs) of FETs 102 and 104. As shown in FIG. 2D, the gate-to-source voltage of FET 102 (Vgs1) is not symmetrical to the gate-to-source voltage of FET 104 (Vgs2). This asymmetry results from the different DC voltages present on the source terminals of FETs 102 and 104 when they are turned on. When FET 102 is turned on, 0.7 V is present on its source terminal. The DC voltage from gate terminal to source terminal of FET 102 is determined by subtracting the DC voltage at its source terminal from the DC voltage at its gate terminal. The DC voltage from gate to source of FET 102 is 1.2 V−0.7 V=0.5 V. Thus, the DC level of signal Vgs1 will be shifted down from 0.6 V to 0.5 V. This results in reduced turn-on time for FET 102, as shown in FIG. 2D.

Similarly, when FET 104 is turned on, 0.5 V is present on its source terminal. The DC voltage from gate terminal to source terminal of FET 104 may be determined in the same manner as above to be 1.2 V−0.5 V=0.7 V. Thus, the DC level of signal Vgs2 will be shifted up from 0.6 V to 0.7 V This results in increased turn-on time for FET 104, as shown in FIG. 2D. The imbalance between Vgs1 and Vgs2 of passive mixer 100 shown in FIG. 2D results in increased IM2 distortion. Thus, the linearity performance of passive mixer 100 is degraded by the DC offset.

Efforts have been made to reduce LO self-mixing in order to reduce IM2 distortion. For example, attempts have been made to provide better isolation between the LO input terminals and RF input terminals of the mixer. However, these efforts have not been completely successful because parasitic and lateral signal paths through the substrate, as well as conductive paths between components, are difficult to overcome.

Thus, there remains a need for a passive mixer circuit for use in a direct conversion transceiver employed in wireless communication applications which IM2 distortion due to LO leakage induced DC offsets.

SUMMARY OF THE DISCLOSURE

Therefore, it is an advantage of embodiments of the present invention to overcome the problems in the existing art described above by providing a DC offset tracking and LO DC bias level-shifting network for use with a mixer circuit that reduces or substantially eliminates even order distortion, including IM2 distortion, due to LO leakage induced DC offsets.

According to embodiments of the invention, a DC offset tracking and LO DC bias level-shifting network for use with a mixer circuit having a local oscillator input and an output is described. The network includes an input coupled to the mixer circuit output for receiving a DC voltage present on the mixer circuit output. The DC voltage present on the mixer circuit output includes a DC offset component.

The network further includes a level shifting circuit coupled to the input for level shifting the received DC voltage a predetermined amount. An output of the level shifting circuit is coupled to the local oscillator input for outputting the level shifted DC voltage to the local oscillator input.

According to a preferred embodiment of the invention, the level shifting circuit includes a first P-Channel MOSFET (PFET) configured as a source follower. The gate terminal of the first PFET may be coupled to the mixer circuit output for receiving a DC voltage present on the mixer circuit output. The first PFET is biased such that when it is turned on, a value of a DC voltage on its source terminal varies from the received DC voltage present on its gate terminal by a predetermined amount. The predetermined amount may be selected by adjusting a first current source coupled to the source terminal of the first PFET.

The level shifting circuit further includes a second PFET having its source terminal coupled to the source terminal of the first PFET. The second PFET may be a long channel device having a large "on" resistance to DC current flow. The drain terminal of the second PFET may be coupled to the local oscillator input. When the second PFET is turned on, a value of a DC voltage present on its drain terminal is substantially the same as the value of the DC voltage present on its source terminal and is provided to the to the local oscillator input.

The level shifting circuit further includes an N-Channel MOSFET (NFET) for turning on the second PFET. The NFET has a gate terminal coupled to the source terminals of the first and second PFETs. A current source is coupled to the source terminal of the NFET and is adjustable for biasing the NFET and the second PFET.

These and other features and advantages of embodiments of the invention will be apparent to those skilled in the art from the following detailed description of embodiments of the invention, when read with the drawings and appended claims.

BRIEF DESCRIPTION OF THE DRAWINGS

The present invention is illustrated by way of example, and not by way of limitation, in the figures of the accompanying drawings and in which.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Embodiments of the present invention relate, generally, to communication systems and processes which have RF transceivers employing mixers for converting a signal from a low frequency to a high frequency or a high frequency to a low frequency by mixing the signal with another signal.

RF transceivers employing mixers according to embodiments of the present invention may be employed in a variety of communications electronics, including wireless transmission systems as well as wired systems. Thus, embodiments of the invention described herein may involve various forms of communications systems. However, for purposes of simplifying the present disclosure, preferred embodiments of the present invention are described herein, in relation to wireless applications, including, but not limited to wireless Local Area Networks (LANs), wireless personal communication devices including radios, cellular telephones, mobile cordless telephones, Personal Digital Assistants (PDAs), Personal Computer Memory Card International Association (PCMCIA) computer interface applications, telemetry systems, global positioning systems (GPS) and other RF devices. In these applications, it is typically desirable to improve the linearity performance of the RF transceiver.

Communications system nodes such as, but not limited to, notebook computers, workstations, personal computers, PDAs or other electronic processing devices may be interconnected via a wireless LAN. Each Communications system node generally includes a communications controller and a wireless transceiver. The communications controller controls data exchange between the computer system and the wireless transceiver. Example functions of the communications controller include channel selection, organization of data packets for transmission and reception across the LAN, and error correction on received data packets.

Figure 3:
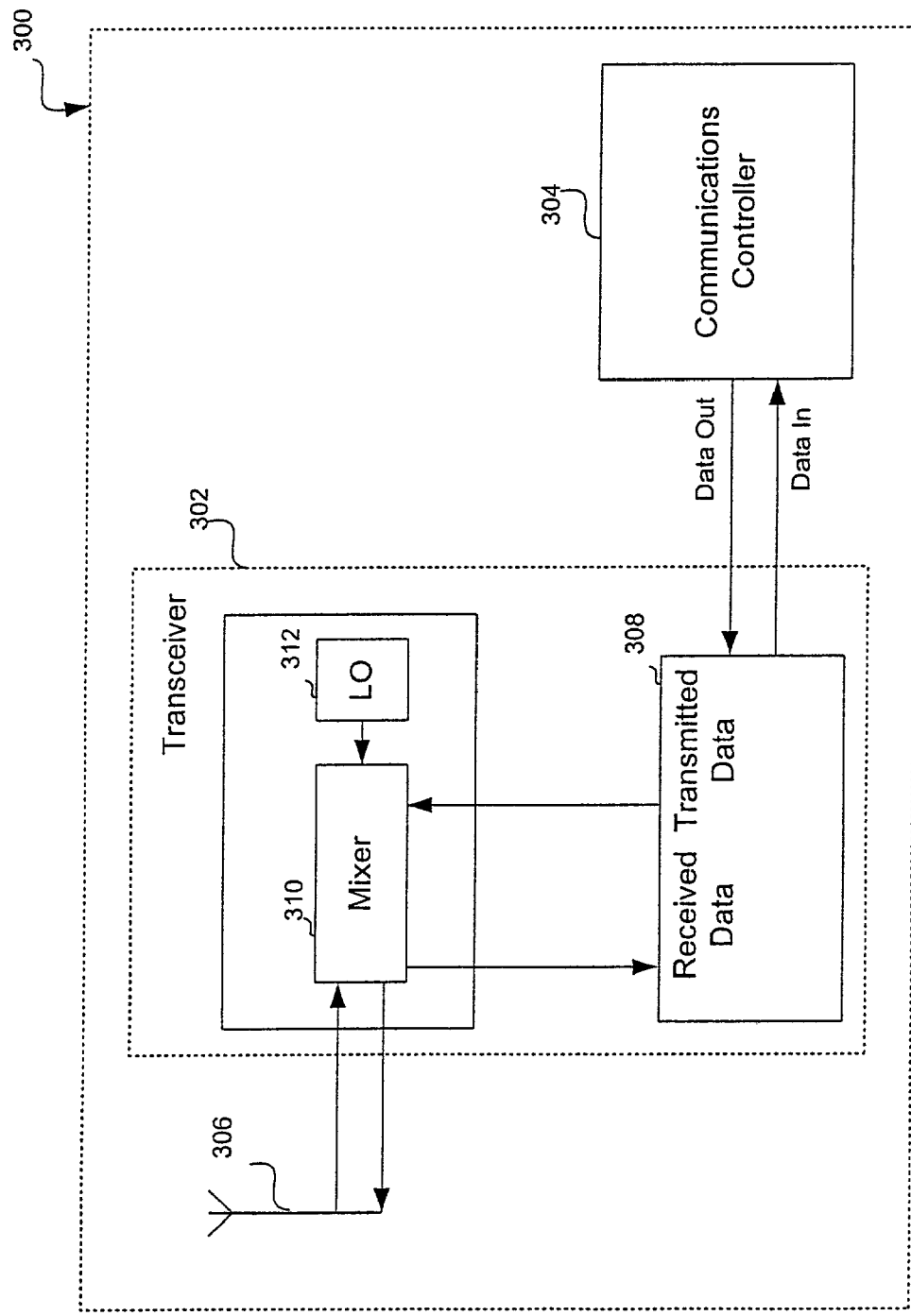
FIG. 3 illustrates a simplified block diagram of a communications system node comprising a mixer, according to embodiments of the present invention.

FIG. 3 is a simplified block diagram of a communications system node 300 such as a notebook computer, cordless telephone, PDA or other RF device in which embodiments of the present invention may be employed. Communications system node 300 is preferably part of a wireless LAN, wide area network (WAN), cellular network or other RF application such as, but not limited to, a cordless or wireless telephone system.

Communications system node 300 includes, but is not limited to, a radio transceiver 302, a communications controller 304, and antenna 306. In one embodiment, the antenna may be incorporated directly into transceiver 302. Transceiver 302 includes transceiver circuits 308, a mixer 310 and a local oscillator 312. An RF input and output of mixer 310 are coupled to antenna 306. The LO input of mixer 310 is coupled to the LO 312. Received data and transmitted data are communicated between communications controller 304, transceiver circuits 308 and mixer 310.

In operation, the communications controller 304 controls the flow of data. The receiver portion of transceiver 302 performs RF demodulation signal processing for communications system node 300. In the receive mode, antenna 306 receives a modulated carrier wave or RF signal and provides it to mixer 310. The LO provides a mixing signal corresponding to a selected channel in the appropriate frequency range. Mixer 310 provides essentially the multiplicative product of the signals from its two inputs to transceiver circuits 308. Transceiver circuits 308 further process the product of the signals and provide a filtered baseband signal to communications controller 304.

Figure 1:
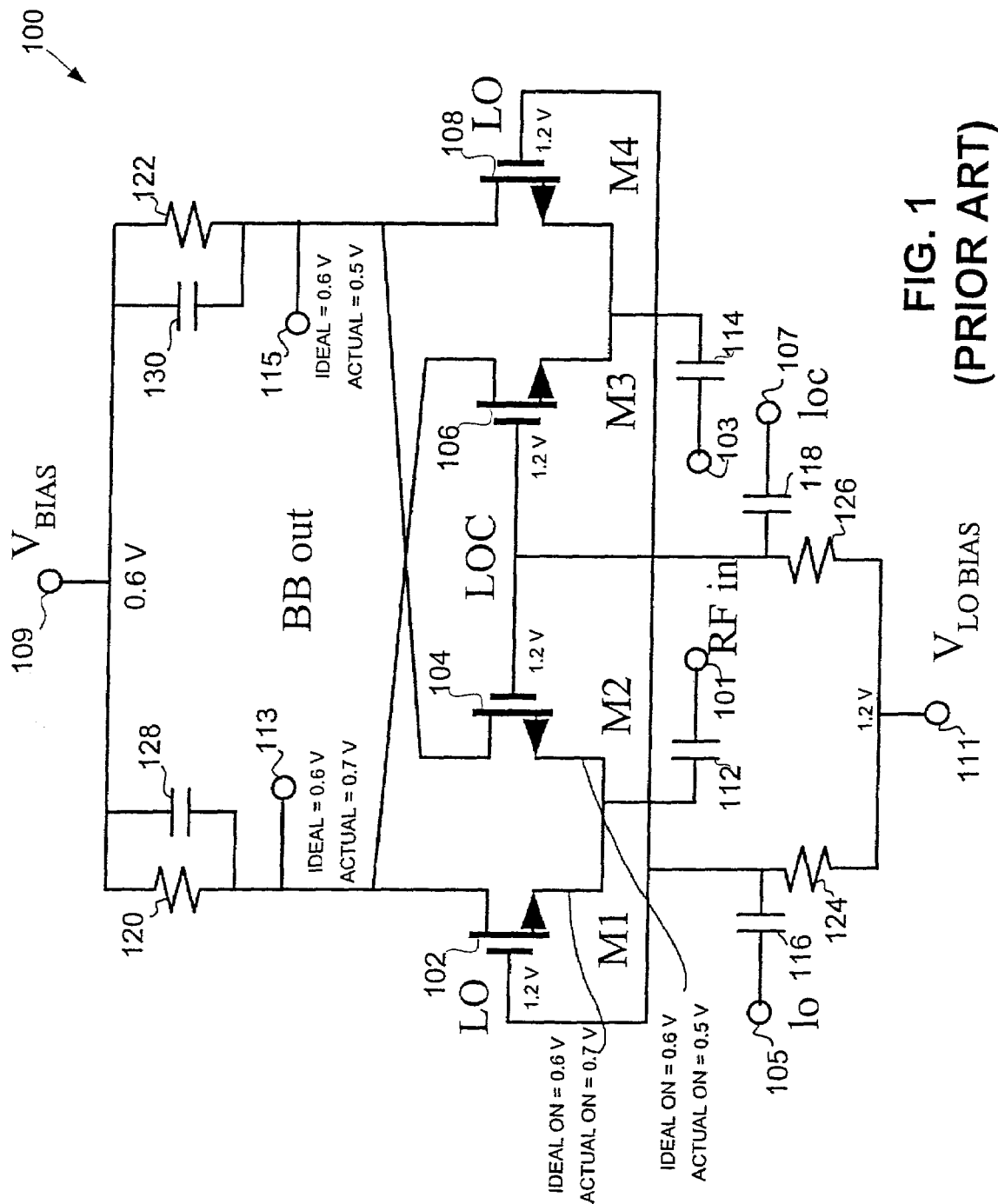
FIG. 1 illustrates a conventional CMOS implemented passive mixer circuit used in a receiver.
Figure 2:
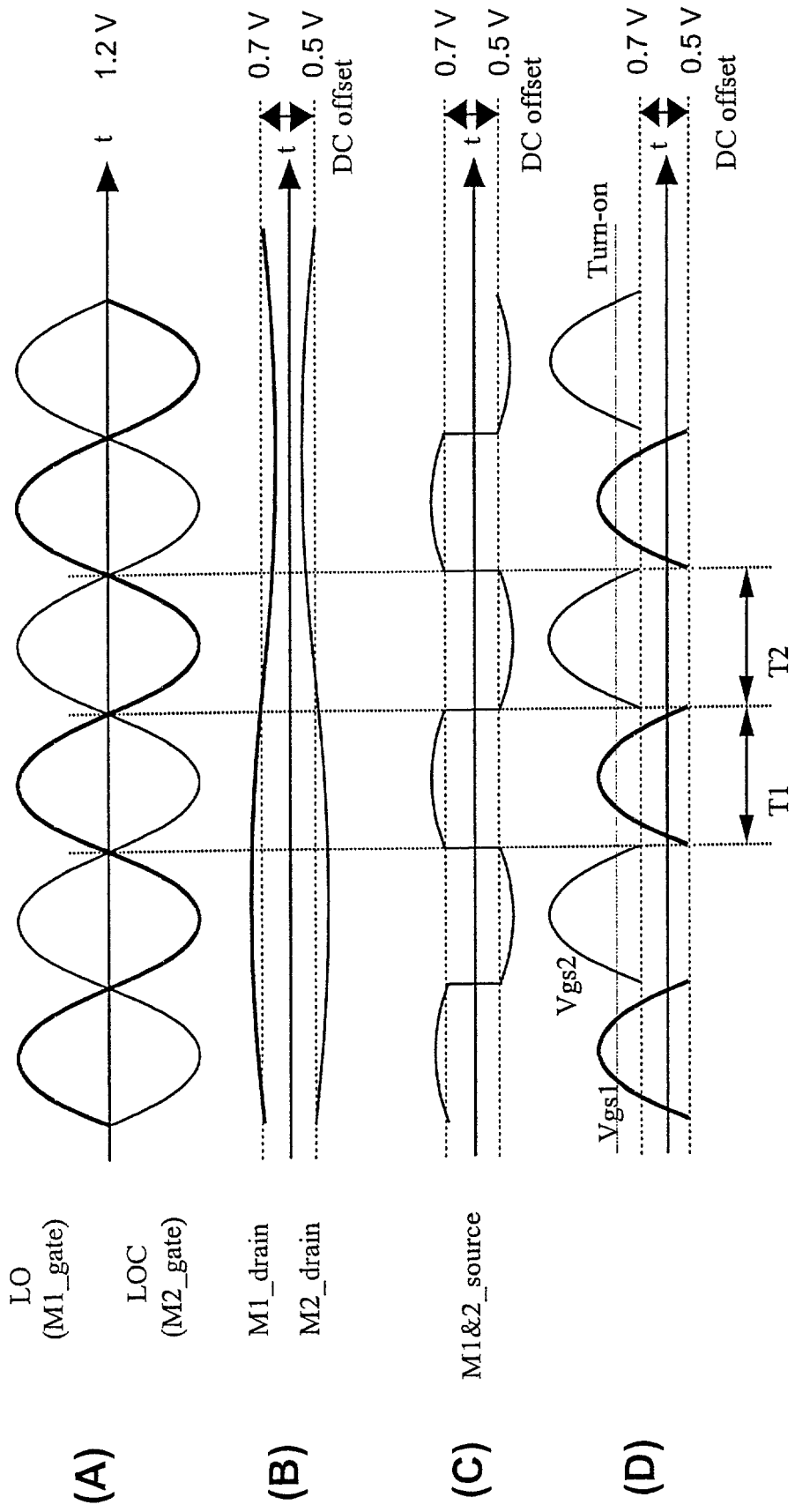
FIG. 2A illustrates local oscillator (LO) and complementary local oscillator (LOC) signals seen at the local oscillator input terminals during operation of the conventional CMOS implemented passive mixer circuit shown in FIG. 1.
FIG. 2B illustrates output signals seen at the output terminals during operation of the conventional CMOS implemented passive mixer circuit shown in FIG. 1.
FIG. 2C illustrates the signal input seen at the RF input during operation of the conventional CMOS implemented passive mixer circuit shown in FIG. 1.
FIG. 2D illustrates the gate-to-source voltage (Vgs) of FETs 102 and 104 during operation of the conventional CMOS implemented passive mixer circuit shown in FIG. 1.
Figure 4:
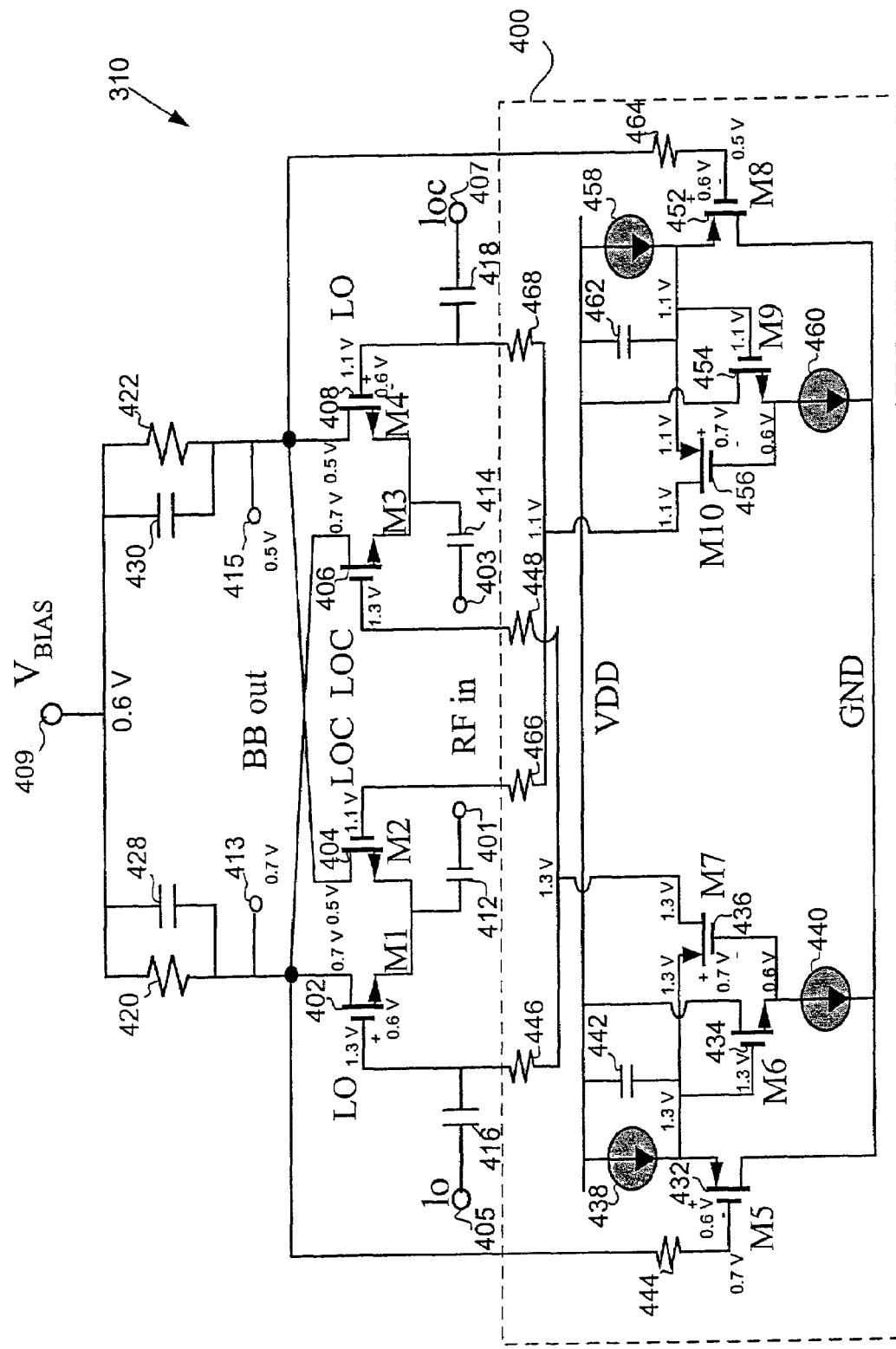
FIG. 4 shows a circuit schematic of a CMOS implemented passive mixer circuit coupled to a DC offset tracking and LO DC bias level-shifting network, according to a preferred embodiment of the present invention.

A circuit schematic of mixer 310 according to a preferred embodiment of the present invention is shown in FIG. 4. The CMOS implemented passive mixer circuit shown in FIG. 4 differs from the conventional passive mixer circuit 100 shown in FIG. 1 by incorporating a DC offset tracking and LO DC bias level-shifting network 400 in place of the DC power and biasing circuit (including $V_{LO\ BIAS}$ terminal 111 and resistors 124 and 126) that is shown in FIG. 1.

In FIG. 4, the RF input signal to be down converted is fed into input terminals 401 and 403 and through capacitors 412 and 414 to the source terminals of the NMOS field effect transistor (FET) differential pairs 402 (M1), 404 (M2) and 406 (M3), 408 (M4) of passive mixer circuit 310. The local oscillator signal (LO) to be mixed with the RF signal is fed into input terminal 405 and through capacitor 416 to the gate terminals of FETs 402 and 408. The 180-degree phase shifted or "complementary" local oscillator signal (LOC) to be mixed with the RF signal is fed into input terminal 407 and through capacitor 418 to the gate terminals of FETs 404 and 406. A transformer or other phase shifting device (not shown) can provide this phase shift input.

A baseband (BB) signal is output at output terminals 413 and 415. DC power and biasing are provided via $V_{BIAS}$ terminal 409 through resistors 420 and 422 to the drain terminals of differential pairs 402, 404 and 406, 408 of passive mixer circuit 310. Capacitors 428 and 430 short higher frequencies appearing on output terminals 413 and 415 to $V_{BIAS}$ terminal 409.

DC power and biasing are also provided by network 400. Network 400 receives power from power rails VDD and GND. Network 400 comprises two identical branches, one for operation with each of the two differential pairs of the passive mixer 310. For simplicity, only the operation of the branch operating with FETs 402 and 406 will be described in detail. Those skilled in the art will recognize that the remaining branch operates in a similar manner in relation to FETs 404 and 408.

The branch of network 400 operating with FETs 402 and 406 comprises FETs 432 (M5), 434 (M6) and 436 (M7), as well as current sources 438 and 440, capacitor 442 and resistors 444, 446 and 448. The drain terminals of FETs 402 and 406 are connected to one side of resistor 444. The other side of resistor 444 is connected to the gate terminal of PFET 432. Current source 438 is connected between the VDD power rail and the source terminal of PFET 432. The source terminal of PFET 432 is also connected to the gate terminal of NFET 434 and the source terminal of PFET 436. The drain terminal of PFET 432 is connected to the GND power rail. The drain terminal of NFET 434 is connected to the VDD power rail. Current source 440 is connected between the source terminal of NFET 434 and the GND power rail. The source terminal of NFET 434 is also connected to the gate terminal of PFET 436. The drain terminal of PFET 436 is connected to the gate terminals of FETs 402 and 406 through resistors 446 and 448, respectively. One side of capacitor 442 is connected to the VDD power rail. The other side of capacitor 442 is connected to the source terminals of PFET 432 and PFET 436, as well as to the gate terminal of NFET 434.

During operation of passive mixer 310, the DC voltage present at the drain terminals of FETs 402 and 406 is picked up by resistor 444 and is present on the gate terminal of PFET 432. Resistor 444 may have a value of, for example, 50 kilohm. Resistor 444 is not critical to the operation of network 400 and may, in some embodiments, be left out, depending on the application. Thus, in some embodiments, the drain terminals of FETs 402 and 406 may be connected directly to the gate terminal of PFET 432.

PFET 432 is configured as a source follower. The value of current source 438 may be designed to bias PFET 432 such that it has a predetermined gate-to-source DC voltage that is matched to the gate-to-source DC voltage of FETs 402 and 406. For example, if the gate-to-source DC voltage of FETs 402 and 406 is 0.6 V, the value of current source 438 may be designed such that the gate-to-source DC voltage of PFET 432 is also 0.6 V. The DC voltage present at the source terminal of PFET 432 will be equal to the DC voltage at its gate terminal minus its gate-to-source DC voltage.

The DC voltage present at the source terminal of PFET 432 will also be present at the gate terminal of NFET 434, as well as at the source terminal of PFET 436. Capacitor 442 will short higher frequencies appearing at the source terminal of PFET 432 to the VDD power rail.

The value of current source 440 may be designed to properly bias NFET 434 and PFET 436. For example, the value of current source 440 may be designed such that the DC voltage at the source terminal of NFET 434 and the gate terminal of PFET 436 is 0.6 V. The current source 440 biases NFET 434 to be active and to turn on PFET 436.

PFET 436 is a long channel device. During operation of the passive mixer 310, PFET 436 provides a large resistance to DC current flow between its source terminal and drain terminal. In one embodiment, PFET 436 may provide an "on" resistance greater than one gigohm. When PFET 436 is turned on by NFET 434, the value of the DC voltage present at the source terminal of PFET 436 will also be the value of the DC voltage present at the drain terminal of PFET 436. In turn, the value of the DC voltage present at the drain terminal of PFET 436 will be the value of the DC voltage present at the gate terminals of NFETs 402 and 406, through resistors 446 and 448, respectively.

An example of the beneficial operation of network 400 will now be described. It will be assumed that, during operation of passive mixer 310, LO self-mixing has manifested a DC offset of 0.2 V at the output terminals 413 and 415. Thus, for example, a DC voltage of 0.7 V is present on output terminal 413 and a DC voltage of 0.5 V is present on output terminal 415. The DC voltage of 0.7 V present on output terminal 413 is picked up by resistor 444 and appears on the gate terminal of PFET 432. In the present example, current source 438 is designed such that the gate-to-source DC voltage of PFET 432 is equal to the gate-to-source DC voltage of NFET 402, which is 0.6 V.

The DC voltage present at the source terminal of PFET 432 is thus equal to 0.7 V−(−0.6 V)=1.3 V. Thus, 1.3 V is present at both the gate terminal of NFET 434 and the source terminal of PFET 436. In the present example, current source 440 is designed to provide a DC bias voltage of 0.6 V on both the source terminal of NFET 434 and the gate terminal of PFET 436. The 1.3 V present on the gate terminal of NFET 434, along with the 0.6 V present on the source terminal of NFET 434, turns NFET 434 on. In turn, PFET 436 is turned on, passing the 1.3 V on its source terminal to its drain terminal. The DC voltage of 1.3 V is also present at the gate terminals of NFETs 402 and 406, through resistors 446 and 448, respectively.

In a similar manner, the branch of network 400 operating with FETs 404 and 408 and comprising FETs 452 (M5), 454 (M9) and 456 (M10), as well as current sources 458 and 460, capacitor 462 and resistors 464, 466 and 468, picks up the DC voltage of 0.5 V present on output terminal 415 and provides a DC voltage of 1.1 V on the gate terminals of NFETs 404 and 408, as shown in FIG. 4.

Thus, network 400 tracks the DC offset component of the DC voltage manifested at the outputs of passive mixer 310 by LO self-mixing and provides a compensating shift in the DC levels of the LO signal present at the gate terminals of NFETs 402 and 408 and the LOC signal present at the gate terminals of NFETs 404 and 406.

Referring now to FIGS. 5A through 5D, the beneficial effect on the linear performance of passive mixer 310 of the compensating shift in the DC levels of the LO and LOC signals provided by the above-described embodiment of the present invention are illustrated. FIGS. 5A through 5D show waveforms present at the terminals of FETs 402 and 404 during operation of the passive mixer 310.

Figure 5:
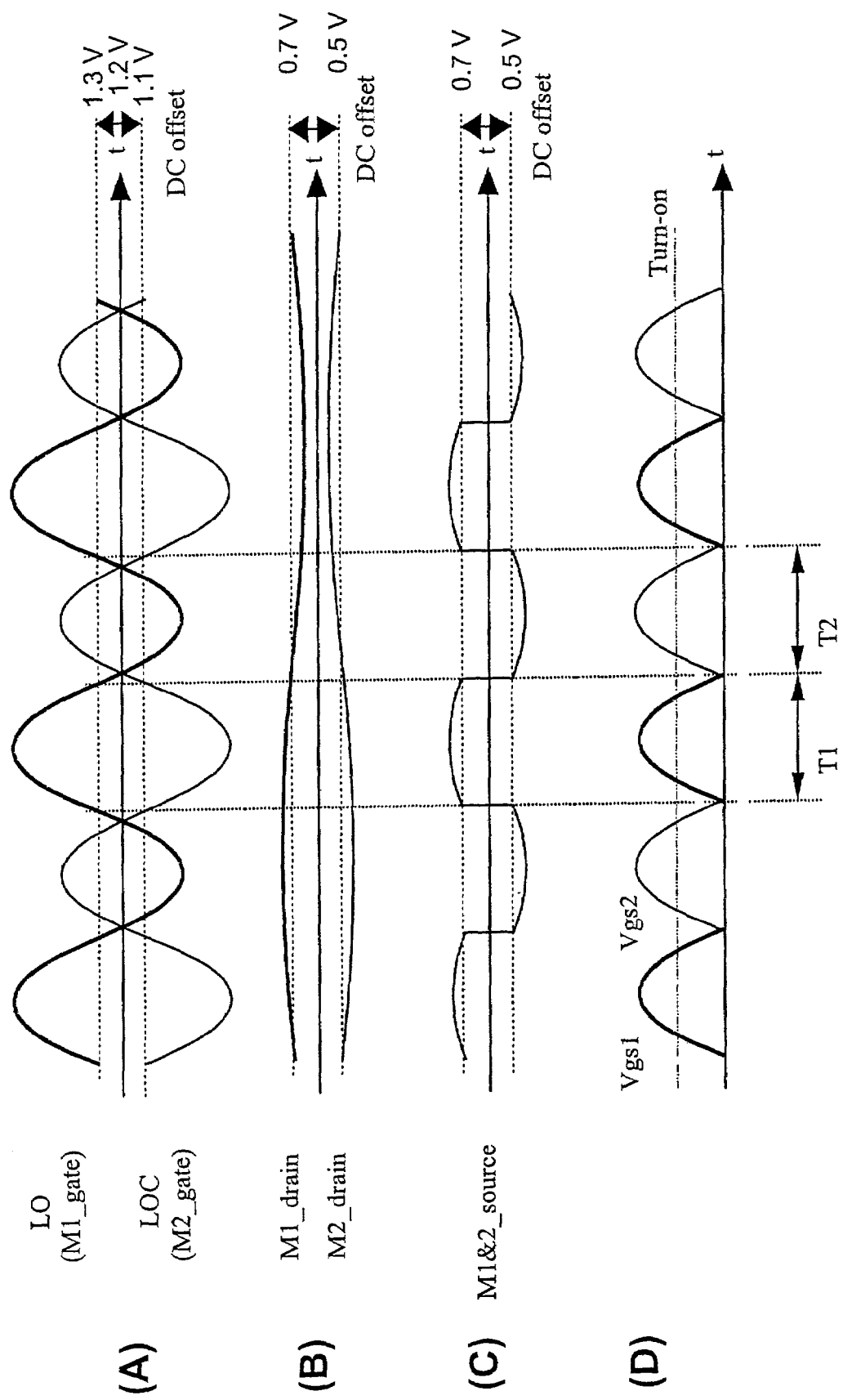
FIG. 5A illustrates level shifted local oscillator (LO) and complementary local oscillator (LOC) signals seen at the local oscillator input terminals during operation of the passive mixer circuit coupled to a DC offset tracking and LO DC bias level-shifting network, according to a preferred embodiment of the present invention.
FIG. 5B illustrates output signals seen at the output terminals during operation of the passive mixer circuit coupled to a DC offset tracking and LO DC bias level-shifting network, according to a preferred embodiment of the present invention.
FIG. 5C illustrates the signal input seen at the RF input during operation of the passive mixer circuit coupled to a DC offset tracking and LO DC bias level-shifting network, according to a preferred embodiment of the present invention.
FIG. 5D illustrates the gate-to-source voltage (Vgs) of FETs 402 and 404 during operation of the passive mixer circuit coupled to a DC offset tracking and LO DC bias level-shifting network, according to a preferred embodiment of the present invention.

FIG. 5A represents the LO and LOC signals superimposed on one another on a horizontal axis representing time t. During operation of passive mixer 310, the LO and LOC signals are input to the gate terminals of FETs 402 and 404, respectively, as shown in FIG. 4. The LO and LOC signals are used to switch their respective FETs on and off. As discussed above, the LO and LOC signals are 180 degrees out of phase and thus when FET 402 is switched on, FET 404 is switched off, and vice versa. As can be seen from FIG. 5A, the embodiment of the present invention shown in FIG. 4 has shifted the DC voltage bias level of the LO signal present at the gate terminal of NFET 402 from 1.2 V to 1.3 V. In addition, the DC voltage bias level of the LOC signal present at the gate terminal of NFET 404 has been level shifted from 1.2 V to 1.1 V by the embodiment of the present invention shown in FIG. 4.

FIG. 5B represents output signals seen at the drain terminals of FETs 402 and 404. The slow-varying solid lines represent the baseband signal waveforms present at the terminals of FETs 402 and 404 during operation of the passive mixer 310. FIG. 5B shows that due to the DC offset of 0.2 V introduced by the LO self-mixing, the DC voltages at the drain terminals of FETs 402 and 404 deviate from each other by 0.2 V. Thus, the output signals present on the drain terminals of FETs 402 and 404 rides on DC levels that are offset by 0.2 V.

FIG. 5C represents the signal input seen at the source terminals of FETs 402 and 404. When either FET 402 or FET 404 turns on, the DC voltage at its drain terminal will be extended to its source terminal. Thus, as shown in FIG. 5C, when FET 402 turns on, the RF input signal at its source terminal will ride on a DC level that is shifted up from the original DC level of 0.6 V to 0.7 V. Similarly, when FET 404 turns on, the RF signal input at its source terminal will ride on a DC level that is shifted down from the original DC level of 0.6 V to 0.5 V.

However, as shown in FIG. 5D which shows the Vgs of FETs 402 and 404, due to the beneficial DC offset tracking and LO DC voltage bias level shifting effect of the embodiment of the present invention shown in FIG. 4, the gate-to-source voltage of FET 402 (Vgs1) is now symmetrical to the gate-to-source voltage of FET 404 (Vgs2). This symmetry results from the shift in the DC voltage bias level of the LO and LOC signals provided by network 400. When FET 402 is turned on, 0.7 V is present on its source terminal. The DC voltage from gate terminal to source terminal of FET 402 is determined by subtracting the DC voltage at its source terminal from the DC voltage at its gate terminal. The DC voltage from gate to source of FET 402 is 1.3 V−0.7 V=0.6 V. Thus, the DC level of signal Vgs1 is 0.6 V. When FET 404 is turned on, 0.5 V is present on its source terminal. The DC voltage from gate terminal to source terminal of FET 404 may be determined in the same manner as above to be 1.1 V−0.5 V=0.6 V. Thus, the DC level of signal Vgs2 is 0.6 V. As can be seen from FIG. 5D, the turn on times of FET 402 and FET 404 are now substantially equal. This balance between Vgs1 and Vgs2 of passive mixer 310 shown in FIG. 5D advantageously results in decreased even order distortion, including IM2 distortion. Thus, the linearity performance of passive mixer 310 is improved by the embodiment of the present invention shown in FIG. 4.

Computer simulations of the conventional passive mixer circuit 100 shown in FIG. 1 and the embodiment of the present invention shown in FIG. 4 were performed. The linearity performance of each was determined by plotting the IM2 and IM3 for both circuits. Examples of simulation results are shown in FIGS. 6 and 7.

Figure 6:
FIG. 6 is a plot of IM2 distortion resulting from a two tone test performed on a computer simulation of the conventional passive mixer circuit shown in FIG. 1.

FIG. 6 shows a plot 600 of a two tone test performed on a computer simulation of passive mixer 100. The horizontal axis of plot 600 represents frequency measured in hertz (Hz) and the vertical axis represents distortion measured in decibels (dB). At a frequency of 20 MHz, the IM2 distortion of the conventional passive mixer 100 is approximately −65 dB.

Figure 7:
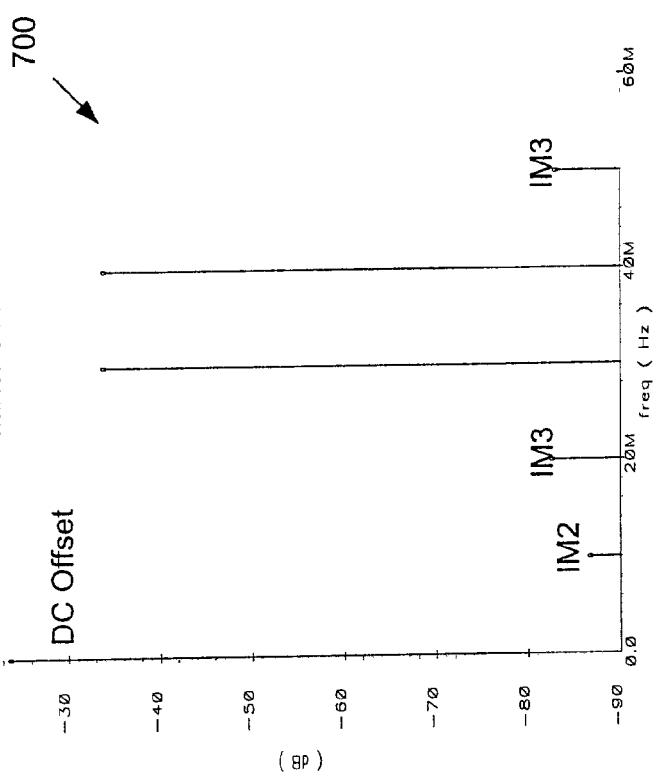
FIG. 7 is a plot of IM2 distortion resulting from a two tone test performed on a computer simulation of the passive mixer circuit coupled to a DC offset tracking and LO DC bias level-shifting network, according to a preferred embodiment of the present invention.

FIG. 7 shows a plot 700 of a two tone test performed on a computer simulation of passive mixer 310. The horizontal axis of plot 700 represents frequency measured in Hz and the vertical axis represents distortion measured in dB. At a frequency of 20 MHz, the IM2 distortion of the passive mixer 310 incorporating the embodiment of the present invention shown in FIG. 4 is approximately −87 dB. This represents a reduction in IM2 distortion of approximately 20 dB.

Thus, some embodiments described above employ a CMOS implementation of a passive mixer circuit coupled to a DC offset tracking and LO DC bias level-shifting network for improving linearity performance in wireless communication systems. Preferred embodiments of the present invention relate to a DC offset tracking and LO DC bias level-shifting network including an input coupled to a mixer circuit output for receiving a DC voltage present on the mixer circuit output. The DC voltage includes an offset component. A level shifting circuit is coupled to the input for level shifting the received DC voltage a predetermined amount. An output of the level shifting circuit is coupled to a local oscillator input for outputting the level shifted DC voltage to the local oscillator input. The level shifted DC voltage outputted to the local oscillator input of the mixer circuit reduces or substantially eliminates distortion in the mixer circuit caused by the DC offset component, including IM2 distortion.

It is to be understood that even though numerous characteristics and advantages of various embodiments of the present invention have been set forth in the foregoing description, together with details of the structure and function of various embodiments of the invention, this disclosure is illustrative only. Changes may be made in detail, especially matters of structure and management of parts within the principles of the present invention to the full extent indicated by the broad general meaning of the terms in which the appended claims are expressed. For example, although embodiments of the present invention are described in which a DC offset tracking and LO DC bias level-shifting network comprises PMOS and NMOS FETs to perform the functions of the network, any suitable switching device may be used. For example, where an NMOS FET is used in the network, a PMOS FET could be substituted and the DC biasing of the FET adjusted accordingly. Similarly, where a PMOS FET is used in the network, an NMOS FET could be substituted.

In addition, although the preferred embodiment described herein is directed to a mixer circuit for use in a communication system node in a wireless LAN, it will be appreciated by those skilled in the art that the teaching of the present invention may be applied to other RF wireless communication systems. In fact, any RF communication system is within the teachings of the present invention, without departing from the scope and spirit of the present invention.

Having disclosed exemplary embodiments and the best mode, modifications and variations may be made to the disclosed embodiments while remaining within the scope of the invention as defined by the following claims.

What is claimed is:

1. An apparatus comprising:
   a mixer circuit having a local oscillator input and an output;
   circuitry including an input directly connected to the mixer circuit output for receiving a DC voltage present on the mixer circuit output, the DC voltage being a DC voltage offset between terminals of the mixer circuit output;
   wherein the circuitry is connected to the input to obtain the DC voltage offset for use in controlling mixer circuit signal input bias, and an output of the circuitry is coupled to the local oscillator input for feeding back the DC voltage offset to the local oscillator input;
   wherein the DC voltage offset is fed back to control bias voltage of the local oscillator input of the mixer circuit by shifting DC levels of the local oscillator inputs separately such that distortion in the mixer circuit is reduced.

2. The apparatus recited in claim 1, wherein the DC voltage offset fed back to the local oscillator input of the mixer circuit reduces even order distortion in the mixer circuit.

3. The apparatus recited in claim 1, wherein the DC voltage offset is level shifted a predetermined amount.

4. The apparatus recited in claim 1, wherein the mixer circuit is a direct conversion mixer circuit.

5. The apparatus recited in claim 1, wherein the mixer circuit is a passive mixer circuit.

6. The apparatus recited in claim 1, wherein the circuitry comprises:
   a first switching device including a first terminal, a second terminal and a third terminal, the first terminal being coupled to the mixer circuit output and adapted for receiving the DC voltage present on the mixer circuit output, the first switching device being biased such that when the first switching device is turned on, a value of a DC voltage on the second terminal varies from the received DC voltage by a predetermined amount.

7. The apparatus recited in claim 6, wherein the predetermined amount is selected by adjusting a first current source.

8. The apparatus recited in claim 7, wherein the first current source is coupled between a first power rail and the second terminal.

9. The apparatus recited in claim 8, wherein the third terminal is coupled to a second power rail.

10. The apparatus recited in claim 8, wherein the circuitry further comprises a filter capacitor coupled between the first power rail and the second terminal.

11. The apparatus recited in claim 6, wherein the circuitry further comprises a resistor coupled between the mixer circuit output and the first terminal.

12. The apparatus recited in claim 6, wherein the first switching device is configured as a source follower.

13. The apparatus recited in claim 6, wherein the first switching device is a field effect transistor (FET) and wherein the first terminal is a gate terminal, the second terminal is a source terminal and the third terminal is a drain terminal.

14. The apparatus recited in claim 13, wherein the FET is a P-Channel Metal Oxide Semiconductor Field Effect Transistor (PMOS FET).

15. The apparatus recited in claim 6, wherein the circuitry further comprises:
   a second switching device including a fourth terminal, a fifth terminal and a sixth terminal, the fifth terminal being coupled to the second terminal, the sixth terminal being coupled to the local oscillator input, the second switching device being biased such that when the second switching device is turned on, a value of a DC voltage present on the sixth terminal is substantially the same as the value of the DC voltage present on the fifth terminal.

16. The apparatus recited in claim 15, wherein when the second switching device is turned on, a large resistance is present between the fifth and sixth terminals.

17. The apparatus recited in claim 16, wherein the resistance is greater than one gigohm.

18. The apparatus recited in claim 15, wherein the second switching device is a long channel device.

19. The apparatus recited in claim 15, wherein the second switching device is a FET and wherein the fourth terminal is a gate terminal, the fifth terminal is a source terminal and the sixth terminal is a drain terminal.

20. The apparatus recited in claim 19, wherein the FET is a PMOS FET.

21. The apparatus recited in claim 15, wherein the circuitry further comprises:
   a third switching device including a seventh terminal, an eighth terminal and a ninth terminal, the seventh terminal being coupled to the second terminal, the eighth terminal being coupled to the fourth terminal, the ninth terminal being coupled to a first power rail, the third switching device being biased such that when the third switching device is turned on, the second switching device also turns on.

22. The apparatus recited in claim 21, wherein the third switching device is biased by adjusting a second current source.

23. The apparatus recited in claim 22, wherein the second current source is coupled between the eighth terminal and a second power rail.

24. The apparatus recited in claim 21, wherein the third switching device is a FET and wherein the seventh terminal is a gate terminal, the eighth terminal is a source terminal and the ninth terminal is a drain terminal.

25. The apparatus recited in claim 24, wherein the FET is an NMOS FET.

26. The apparatus recited in claim 21, wherein the circuitry further comprises a resistor coupled between the ninth terminal and the local oscillator input.

27. In a mixer circuit for use in a transceiver, a method for reducing even order distortion, comprising:
   providing an input directly connected to the mixer circuit output for receiving a DC voltage present on the mixer circuit output, the DC voltage being a DC voltage offset between terminals of the mixer circuit output;
   providing a circuitry connected to the input to obtain the DC voltage offset for use in controlling mixer circuit signal input bias; and
   providing an output of the circuitry coupled to the local oscillator input for feeding back the DC voltage offset to the local oscillator input;
   wherein the DC voltage offset is fed back to control bias voltage of the local oscillator input of the mixer circuit by shifting DC levels of the local oscillator inputs separately such that distortion in the mixer circuit is reduced.

28. The method recited in claim 27, wherein the DC voltage offset fed back to the local oscillator input of the mixer circuit reduces even order distortion in the mixer circuit.

29. The apparatus recited in claim 27, wherein the DC voltage offset is level shifted a predetermined amount.

30. The method recited in claim 27, wherein the mixer circuit is a direct conversion mixer circuit.

31. The method recited in claim 27, wherein the mixer circuit is a passive mixer circuit.

32. A communications system for use in a wireless network that comprise an antenna, and a communications controller for controlling data flow, the communication system comprising:
   a transceiver including a mixer circuit having a local oscillator input and an output; and
   a DC offset tracking and local oscillator DC bias level-shifting network for use with the mixer circuit, the network comprising:
      an input coupled to the mixer circuit output for receiving a DC voltage present on the mixer circuit output, the DC voltage being a DC voltage offset between terminals of the mixer circuit output;
      a level shifting circuit coupled to the input for level shifting the received DC voltage; and
      an output of the level shifting circuit coupled to the local oscillator input for feeding back the level shifted DC voltage to the local oscillator input;
   wherein the level shifted DC voltage is fed back to control bias voltage of the local oscillator input of the mixer circuit by shifting DC levels of the local oscillator inputs separately such that distortion in the mixer circuit is reduced.

33. The method recited in claim 32, wherein the mixer circuit is a direct conversion mixer circuit.

34. The method recited in claim 32, wherein the mixer circuit is a passive mixer circuit.

35. A local oscillator DC bias level-shifting network for use with a mixer circuit having a local oscillator input and an output, the network comprising:
   a network input directly connected to the output of the mixer circuit;
   a network output coupled to the local oscillator input of the mixer circuit;
   means for receiving at the network input a DC voltage present on the output of the mixer circuit, the DC voltage being a DC voltage offset between terminals of the mixer circuit output;
   means for level shifting the received DC voltage; and
   means for feeding back the level shifted DC voltage to the local oscillator input;
   wherein the level shifted DC voltage is fed back to control bias voltage of the local oscillator input of the mixer circuit by shifting DC levels of the local oscillator inputs separately such that distortion in the mixer circuit is reduced.

* * * * *